(12) United States Patent
Sakamoto

(10) Patent No.: US 6,169,323 B1
(45) Date of Patent: *Jan. 2, 2001

(54) SEMICONDUCTOR DEVICE WITH IMPROVED LEADS

(75) Inventor: Akira Sakamoto, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/928,399

(22) Filed: Sep. 12, 1997

(30) Foreign Application Priority Data

Feb. 25, 1997 (JP) .................................................. 9-040717

(51) Int. Cl.$^7$ .......................... H01L 23/495; H01L 23/48; H01L 23/52

(52) U.S. Cl. .......................... 257/667; 257/692; 257/693; 257/696; 257/697

(58) Field of Search .................................. 257/666, 667, 257/690, 692, 693, 696, 697, 777, 787, 686

(56) References Cited

U.S. PATENT DOCUMENTS

| 4,920,074 | | 4/1990 | Shimizu et al. . | |
|---|---|---|---|---|
| 5,214,845 | * | 6/1993 | King et al. | 257/787 |
| 5,270,492 | | 12/1993 | Fukui . | |
| 5,455,200 | * | 10/1995 | Bigler et al. | 257/667 |
| 5,554,886 | * | 9/1996 | Song | 257/666 |
| 5,835,988 | * | 11/1998 | Ishii | 257/686 |

FOREIGN PATENT DOCUMENTS

| 004039536 | * | 12/1991 | (DE) | 257/787 |
|---|---|---|---|---|
| 364089353 | * | 4/1989 | (JP) | 257/696 |
| 004039536 | | 12/1991 | (JP) . | |
| 4-171856 | | 6/1992 | (JP) . | |
| 5-47954 | | 2/1993 | (JP) . | |
| 5-326807 | | 12/1993 | (JP) . | |
| 6-252310 | | 9/1994 | (JP) . | |
| 8-316371 | | 11/1996 | (JP) . | |

\* cited by examiner

*Primary Examiner*—Mahshid Saadat
*Assistant Examiner*—Jesse A Fenty
(74) *Attorney, Agent, or Firm*—Venable; Robert J. Frank; James R. Burdett

(57) ABSTRACT

A semiconductor device packaged in a plastic package provided with a semiconductor device chip, a plurality of leads each of which is bonded with each of the bonding pads of the semiconductor device chip, and a plastic mold packaging the semiconductor device chip bonded with the leads, allowing the leads to project themselves from the bottom surface thereof and to extend outward along the bottom surface thereof, wherein each of the leads has a horizontal shape in which the surface of the edge thereof is a half circle, a half ellipse or a half polygon convex toward the inward direction.

8 Claims, 14 Drawing Sheets

SEMICONDUCTOR DEVICE WITH IMPROVED LEADS

FIELD OF THE INVENTION

This invention relates to a semiconductor device and a method for production thereof. More specifically, this invention relates to an improvement applicable to a semiconductor device packaged in a small outline nonlead plastic package and which is developed for the purpose to improve the mechanical reliability thereof and to enhance integration thereof and a method for producing a semiconductor device packaged in a small outline nonlead package, of which the connection strength between the lead and a wiring of a board on which the semiconductor device is mounted, is enhanced.

BACKGROUND OF THE INVENTION

A package employable for packaging a semiconductor device is typically classified into a ceramic package or a plastic package. Referring to FIG. 1, the plastic package originated from a Dual-Inline package evolved to a small outline package defined as a plastic package whose leads 4 horizontally extend from both sides of a plastic mold 1 and turn downward then toward the horizontal direction to extend along the surface of a board 5 on which the plastic package is mounted. In the drawing, a semiconductor device chip 2 bonded with the leads 4 by means of gold wires 3 is molded in the plastic mold 1.

Referring to FIG. 2, the small outline package further evolved to a small outline nonlead package, in which leads 4 each of which is bonded with each of the pads of a semiconductor device chip 2 by means of a gold wire 3 are arranged along the bottom surface of a plastic mold 1.

Referring to FIG. 3, a semiconductor device packaged in a small outline nonlead package is mounted on a board 5, in a manner that each of the leads 4 is soldered to each of the wirings 6 printed on a board 5 made of a ceramic material, glass epoxy resin or the like, by application of solder, copper solder (copper paste), silver solder (silver paste) or the like.

The material usually employed for such a lead as was described above is a Ni—Fe alloy containing Ni by 42 weight % and Fe by 58 weight % or a copper alloy such as phosphor bronze. These materials have a less magnitude of wettability for solder, copper paste, silver paste and the like.

In the foregoing structure in which a semiconductor device packaged in a small outline nonlead package is mounted on a board, connection between the lead 4 and the wiring 6 is not necessarily reliable. During impulse tests and/or during practical operation, cracks grow in a soldering material 7 to cause disunion of the lead 4 from the wiring 6. This is a serious drawback to reduce the mechanical reliability of a semiconductor device.

In the case of a semiconductor device packaged in a ceramic package, a semiconductor device having a plurality of ceramic packaged semiconductor devices piled on one another is available in the prior art. Such a piled structure is, however, not available for a semiconductor device packaged in a plastic package. Accordingly, a semiconductor device packaged in a plastic package on which one or more electronic components and/or plastic packaged semiconductor devices are arranged, is required to be developed.

OBJECTS AND SUMMARY OF THE INVENTION

A first object of this invention is to provide a semiconductor device packaged in a plastic package and having leads horizontally extending along the bottom surface of the plastic package, wherein the mechanical strength is enhanced for connection conducted by soldering the leads and a conductive object, such as wirings, with which the leads are mechanically and electrically connected.

A second object of this invention is to provide a method for producing a semiconductor device packaged in a plastic package and having leads horizontally extending along the bottom surface of the plastic package, wherein the mechanical strength is enhanced for connection conducted by soldering the leads and a conductive object, such as wirings, with which the leads are mechanically and electrically connected.

A third object of this invention is to provide a semiconductor device packaged in a plastic package on which one or more electronic components and/or plastic packaged semiconductor devices are arranged.

To achieve the first and second objects of this invention, this invention is based on a concept that the surface area for soldering is increased by making the end surface of a lead non-flat, uneven, pulsating or sawtooth shaped.

Accordingly, to achieve the first object of this invention, a semiconductor device in accordance with this invention comprises a semiconductor device chip, a plurality of leads each of which is bonded with each of the bonding pads of the semiconductor device chip, and a plastic mold packaging the semiconductor device chip bonded with the leads, allowing the leads to project themselves from the bottom surface thereof and to extend outward along the bottom surface thereof,
wherein each of the leads has a horizontal shape in which the surface of the edge thereof is uneven.

Following the foregoing concept, the horizontal shape of the edge of the lead can be a half circle, a half ellipse or a half polygon convex toward the inward direction.

Following the foregoing concept, one or more holes can be made for the lead.

Following the foregoing concept, the edge of the lead can be severed in the shape of a sector.

To achieve the first object of this invention, a semiconductor device in accordance with this invention comprises a semiconductor device chip, a plurality of leads each of which is bonded with each of the bonding pads of the semiconductor device chip, and a plastic mold packaging the semiconductor device chip bonded with the leads, allowing the leads to project themselves from the bottom surface thereof and to extend outward along the bottom surface thereof,
wherein the end of each of the leads is bent downward by 180° to make the side view the shape of J.

To achieve the first object of this invention, a semiconductor device in accordance with this invention comprises a semiconductor device chip, a plurality of leads each of which is bonded with each of the bonding pads of the semiconductor device chip, a plastic mold packaging the semiconductor device chip bonded with the leads, allowing the leads to project themselves from the bottom surface thereof and to extend outward along the bottom surface thereof, and a plurality of plated metal plates arranged along the sides of the plastic mold at locations corresponding to those of the leads.

To achieve the first object of this invention, a semiconductor device in accordance with this invention comprises a semiconductor device chip, a plurality of leads each of which is bonded with each of the bonding pads of the semiconductor device chip, a plastic mold packaging the semiconductor device chip bonded with the leads, allowing the leads to project themselves from the bottom surface thereof and to extend outward along the bottom surface thereof, a plurality of longitudinal recesses produced along the sides of the plastic mold at locations corresponding to those of the leads, and a plurality of plated metal plates arranged in the longitudinal recesses.

To achieve the first object of this invention, a semiconductor device in accordance with this invention comprises a semiconductor device chip, a plurality of leads each of which is bonded with each of the bonding pads of the semiconductor device chip, a plastic mold packaging the semiconductor device chip bonded with the leads, allowing the leads to project themselves from the bottom surface thereof, a plurality of longitudinal recesses produced along the sides of the plastic mold at locations corresponding to those of the leads, a plurality of plated metal plates arranged in the longitudinal recesses, and a plurality of plated metal plates arranged along the top surface of the plastic mold in continuation to the plated metal plates arranged along the sides of the plastic mold.

To achieve the second object of this invention, a method for producing a semiconductor device comnprises a step for fixing a semiconductor device chip on a lead frame having lead bars each of which has an opening at the end thereof, a step for bonding each of the leads and each of the bonding pads of the semiconductor device chip, a step for molding the semiconductor device chip bonded with the leads in a plastic mold, a step for plating a material having a large magnitude of wettability for a soldering material, and a step for severing the leads at the center of the opening.

To achieve the third object of this invention, a semiconductor device in accordance with this invention comprises a semiconductor device chip, a plurality of leads each of which is bonded with each of the bonding pads of the semiconductor device chip, a plastic mold packaging the semiconductor device chip bonded with the leads, allowing the leads to project themselves from the bottom surface thereof and to extend outward along the bottom surface thereof, a plurality of longitudinal recesses produced along the sides of the plastic mold at locations corresponding to those of the leads, a plurality of plated metal plates arranged in the longitudinal recesses, and a plurality of plated metal plates arranged along the top surface of the plastic mold in continuation to the plated metal plates arranged along the sides of the plastic mold,
wherein one or more electronic components and/or one or more semiconductor devices packaged in plastic packages are arranged on the plated metal plates arranged on the top surface of the plastic mold.

In any of the foregoing semiconductor devices packaged in plastic mold, the leads can be plated a material having a large magnitude of wettability for a soldering material.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

Referring to drawings, a detailed description will be presented below for semiconductor devices in accordance with 8 embodiments of this invention.

First Embodiment

A semiconductor device packaged in a small outline nonlead plastic package having leads each of which has an edge whose shape is a half circle, a half ellipse or a half polygon convex toward the inward direction.

Figure 1:
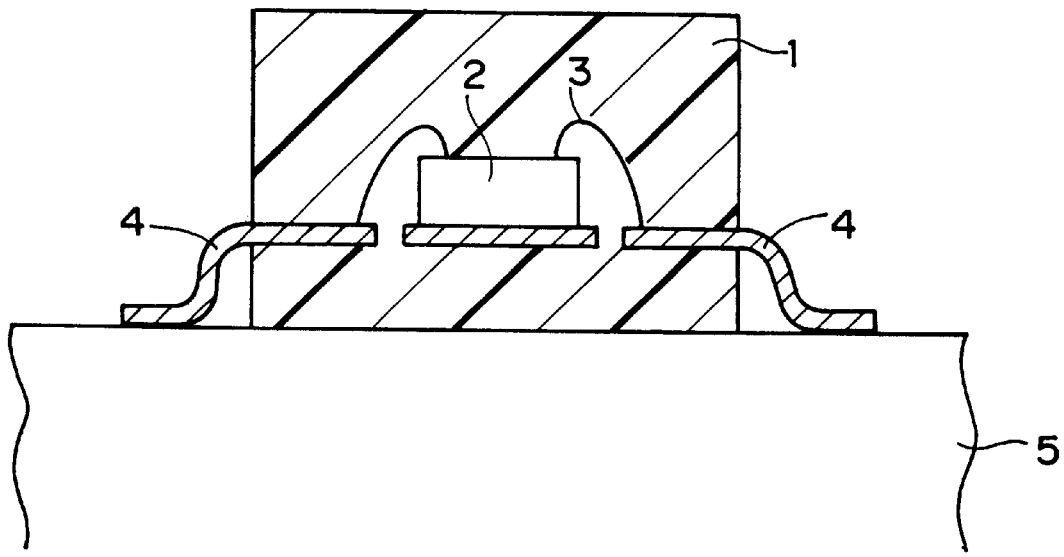
FIG. 1 is a schematic front view of a semiconductor device packaged in a small outline package available in the prior art.
Figure 2:
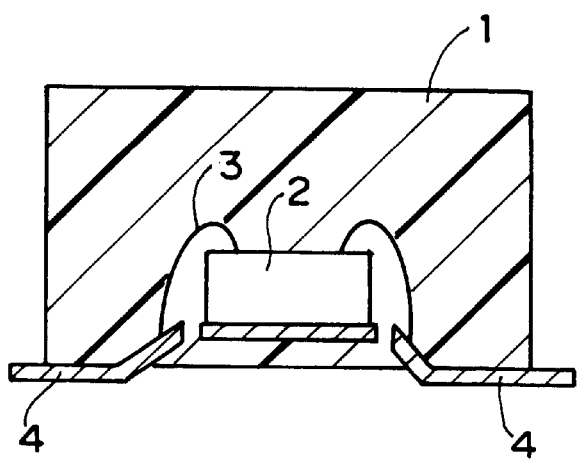
FIG. 2 is a small outline nonlead package available in the prior art.
Figure 3:
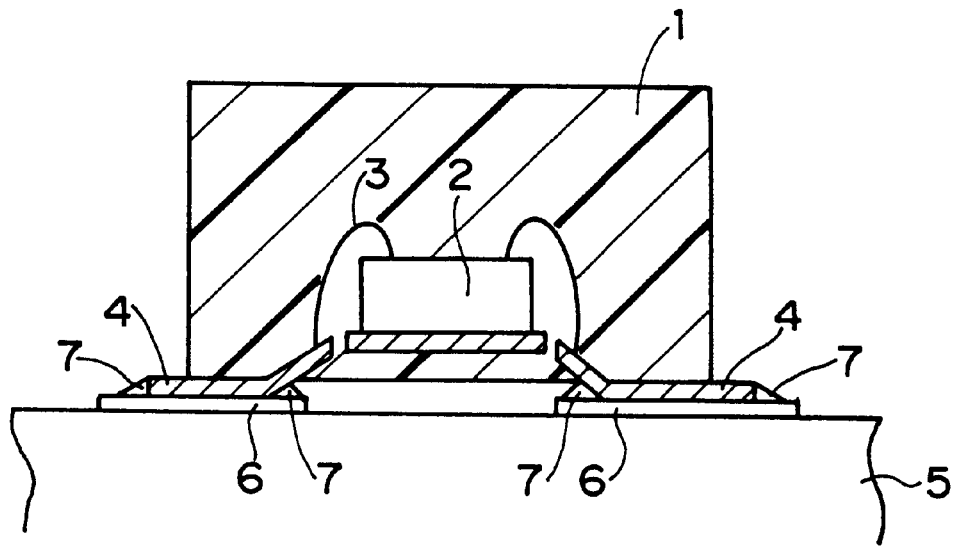
FIG. 3 is a schematic front view of a semiconductor device packaged in a small outline nonlead package available in the prior art, being mounted on a board.
Figure 4:
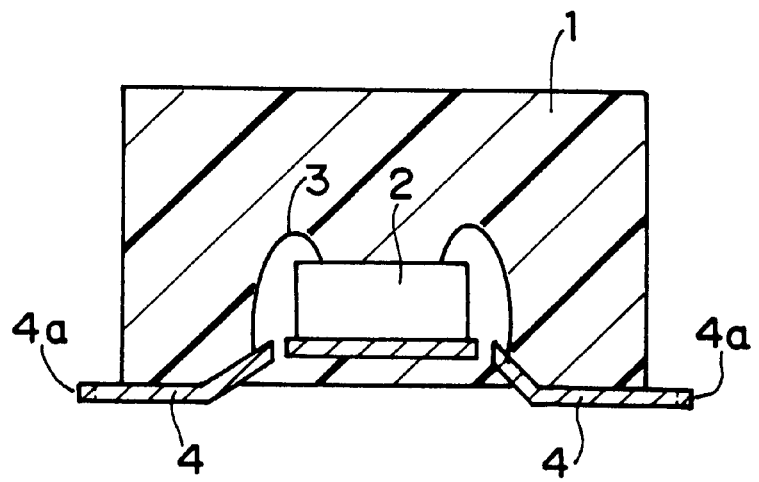
FIG. 4 is a schematic front view of a semiconductor device packaged in a small outline nonlead package in accordance with the first embodiment of this invention.
Figure 5:
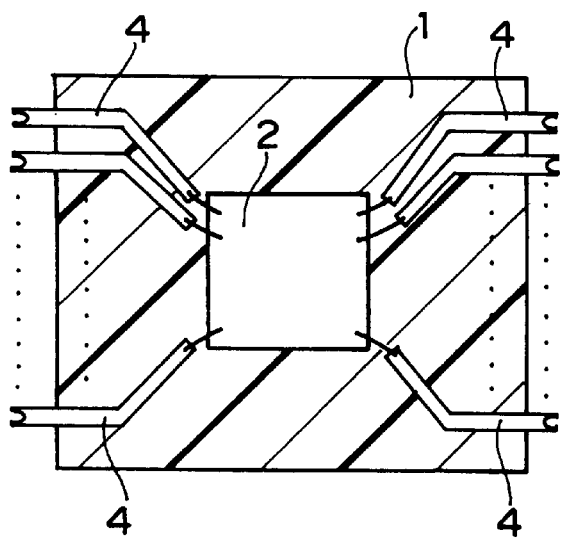
FIG. 5 is a schematic plan view of a semiconductor device packaged in a small outline nonlead package in accordance with the first embodiment of this invention.

Referring to FIGS. 4 and 5, a semiconductor device chip 2 that is electrically connected to leads 4 by means of bonding wires 3 is molded in a plastic mold 1, and the leads 4 are arranged along the bottom surface of the plastic mold 1. The horizontal shape of the edge 4a of the leads 4 is a half ellipse convex toward the inward direction. As was described above, referring to FIG. 3, the leads 4 are scheduled to be soldered to wirings 6 by means of a soldering material 7 such as solder, copper solder and silver solder.

Figure 6:
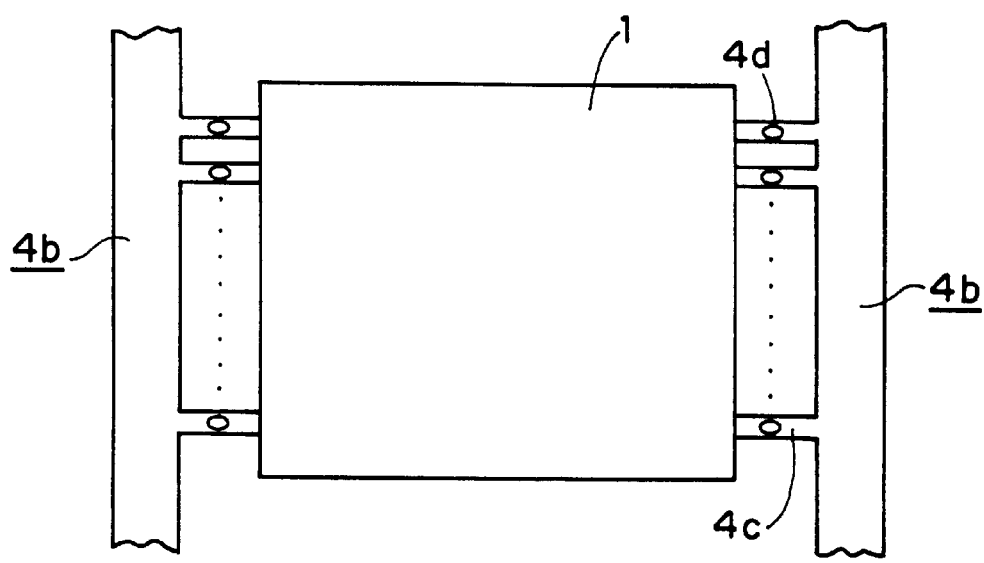
FIG. 6 is a schematic plan view of a semiconductor device packaged in a small outline nonlead package in accordance with the first embodiment of this invention, under production.

Referring to drawings, a method for producing the semiconductor device packaged in a small outline nonlead plastic package having leads each of which has an edge whose shape is a half circle, a half ellipse or a half polygon convex toward the inward direction, will be described below. Referring to FIG. 6, a roll of lead frame 4b having lead bars 4c which are scheduled to be severed to produce leads 4 and each of which has elliptic hole 4d thereon is prepared. The material usually employed for such a lead as was described above is a Ni—Fe alloy containing Ni by 42 weight % and Fe by 58 weight % or a copper alloy such as phosphor bronze. These materials have a less magnitude of wettability for solder, copper paste, silver paste and the like.

After a semiconductor device chip 2 is fixed on an island (not shown) of the lead frame 4b, and a wire bonding step is conducted, the semiconductor device chip 2 is molded in a plastic mold 1. The semiconductor device chip molded in the plastic mold is not shown in the later drawings. Thereafter, a plating process is conducted to plate a conductive material such as solder, gold or the like which has a large magnitude of wettability for a soldering material such as solder, copper paste and silver paste, on the lead frame 4b. The internal surface of the elliptic holes 4d is also plated the conductive material, such as solder, gold or the like which has a large magnitude of wettability for a soldering material such as solder, copper paste and silver paste.

Referring again to FIG. 6, the lead bars 4c are severed through the center of the elliptic holes 4d to produce leads 4 having the edge 4a whose shape is a half ellipse.

Figure 7:
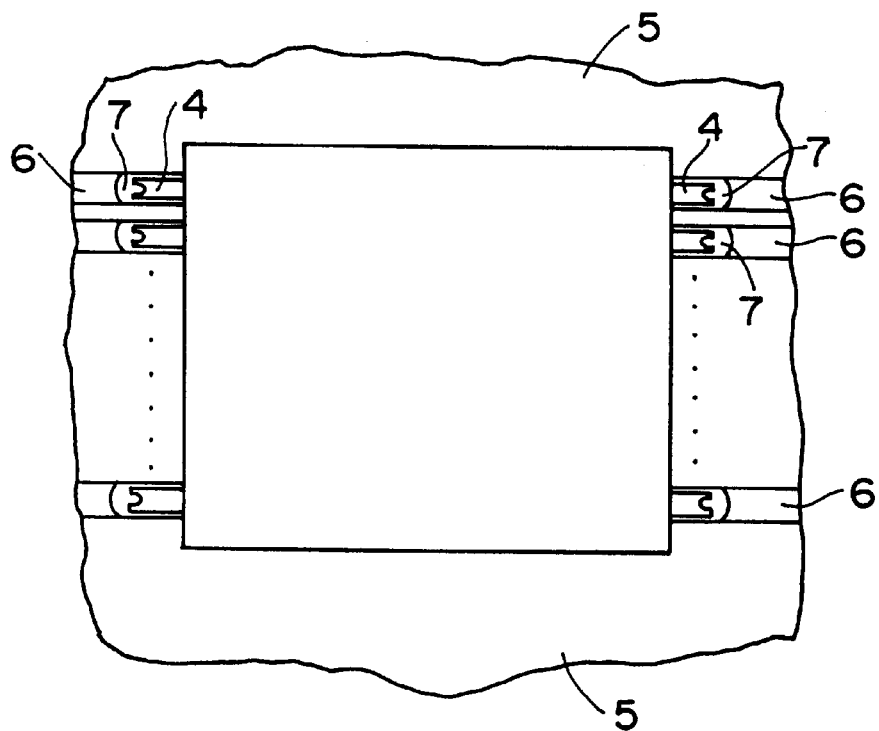
FIG. 7 is a schematic plan view of a semiconductor device packaged in a small outline nonlead package in accordance with the first embodiment of this invention, the packaged semiconductor device being mounted on a board.
Figure 8:
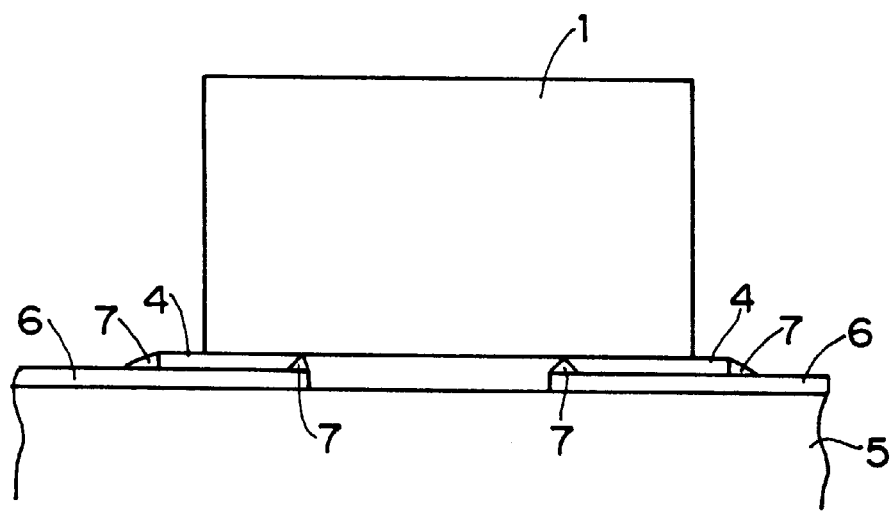
FIG. 8 is a schematic front view of a semiconductor device packaged in a small outline nonlead package in accordance with the first embodiment of this invention, the packaged semiconductor device being mounted on a board.

Now, referring to drawings, how to mount a semiconductor device packaged in a small outline nonlead plastic package in accordance with this embodiment will be described below. Referring to FIGS. 7 and 8, a semiconductor device packaged in a small outline nonlead plastic package in accordance with this embodiment is placed on a board 5 made of e.g. a ceramic material, a glass epoxy resin or the like in a manner to allow the leads 4 to contact wirings 6 of the board 5, and a soldering process is conducted to solder the leads 4 and the wirings 6. A soldering material 7 such as solder, copper paste and silver paste is employed for the soldering process. Since the edge of the leads 4 has a recess having the horizontal shape of a half ellipse convex toward the inward direction, the lead 4 has a large surface area by which soldering is conducted or a large surface area on which a soldering material is deposited. As a result, the connection strength between the leads 4 and the wirings 6 is made large, resulting in an improved mechanical reliability of a semiconductor device packaged in a small outline nonlead plastic package in accordance with this embodiment.

Further, the surface of the lead 4 produced by conducting the method for producing the semiconductor device packaged in a small outline nonlead plastic package having leads each of which has an edge whose shape is a half circle, a half ellipse or a half polygon convex toward the inward direction described above, is covered by a soldering material which has a large magnitude of wettability, excepting on the end surface thereof, the soldering material 7 readily sticks to the surface of the lead 4, resultantly enhancing the connection strength between the leads 4 and the wirings 6 also from this view point.

Second Embodiment

A semiconductor device packaged in a small outline nonlead plastic package having leads each of which has an opening.

Figure 9:
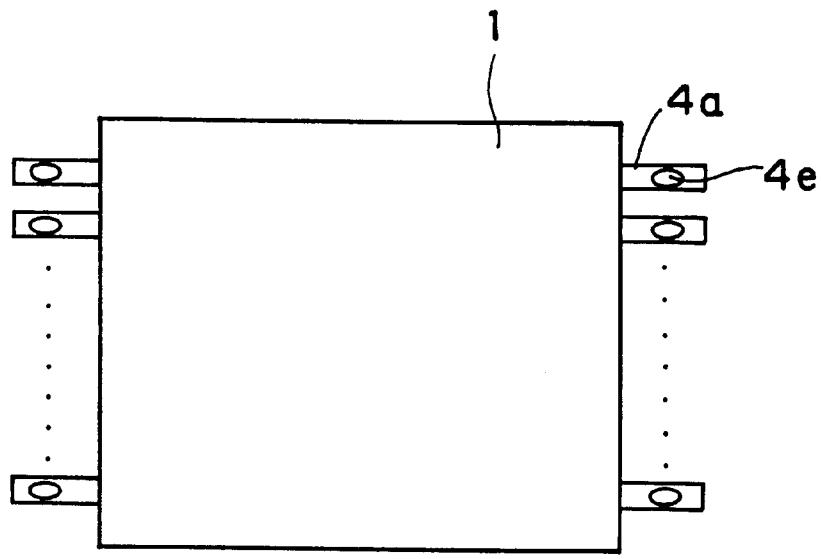
FIG. 9 is a schematic plan view of a semiconductor device packaged in a small outline nonlead package in accordance with the second embodiment of this invention.

Referring to FIG. 9, the leads 4 of a small outline nonlead plastic package in accordance with this embodiment has an opening 4e on the end 4a of the lead 4. Since the internal surface of the opening 4e is plated a soldering material which has a large magnitude of wettability, the openings 4e is effective to increase the area by which soldering is conducted between the leads 4 and the wirings 6, resultantly enhancing the connection strength between the leads 4 and the wirings 6.

Third Embodiment

A semiconductor device packaged in a small outline nonlead plastic package having leads each of which has the edge having the shape of a sector.

Figure 10:
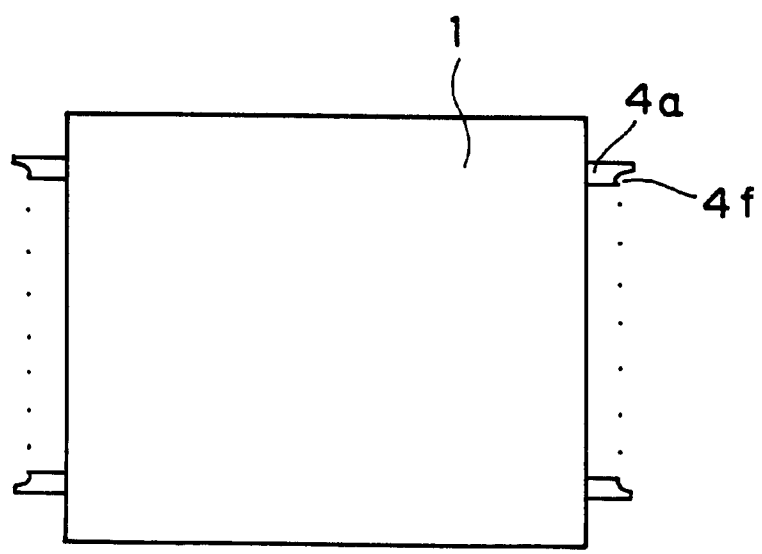
FIG. 10 is a schematic plan view of a semiconductor device packaged in a small outline nonlead package in accordance with the third embodiment of this invention.

Referring to FIG. 10, the end 4a of the leads 4 of a small outline nonlead plastic package of this embodiment is severed in the shape of a sector 4f. Since the surface of the sector-shaped cut end 4f can be plated a soldering material which has a large magnitude of wettability, the sector-shaped cut end 4f is effective to increase the area by which soldering is conducted between the leads 4 and the wirings 6, resultantly enhancing the connection strength between the leads 4 and the wirings 6.

Figure 11:
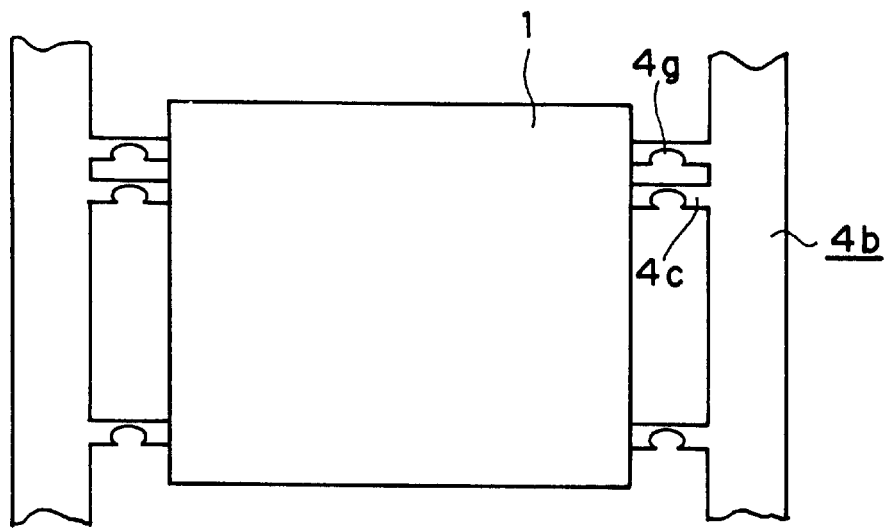
FIG. 11 is a schematic plan view of a semiconductor device packaged in a small outline nonlead package in accordance with the third embodiment of this invention, under production.

In addition, referring to FIG. 11, a method for producing the semiconductor device packaged in a small outline nonlead plastic package having leads each of which has the shape of a sector will be described below. Referring to FIG. 11, a roll of lead frame 4b having lead bars 4c which are scheduled to be severed to produce leads 4 and each of which has an elliptic hole 4g punched off the center thereof, is prepared. After a semiconductor device chip 2 is fixed on an island (not shown) of the lead frame 4b and a wire bonding step is conducted, the semiconductor device chip 2 is molded in a plastic mold 1.

Thereafter, a plating process is conducted to plate a conductive material such as solder, gold or the like on the lead frame 4b. The internal surface of the elliptic holes 4g is also plated the conductive material. Referring to FIG. 10, the lead bars 4c are severed through the center of the elliptic holes 4g to produce the leads 4 having the edge having the shape 4f of a sector.

It is noted that much variety is allowed for the shape of the edge of the leads 4. In other words, the shape of a sector can be replaced by the shape representing a quarter of a circle, a hook or the like, insofar as the shape is effective to increase the dimension of the surface of the end of the leads 4.

Figure 12:
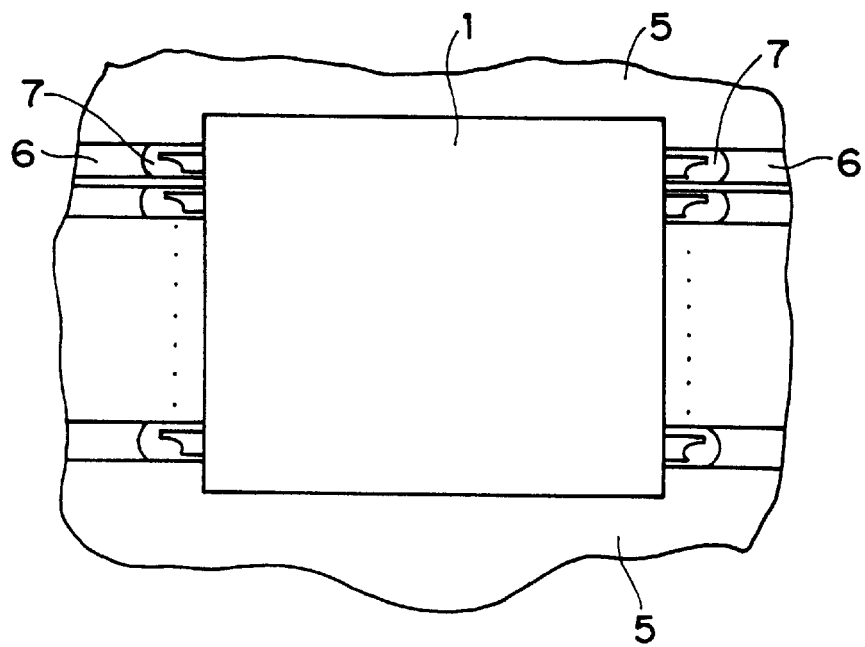
FIG. 12 is a schematic plan view of a semiconductor device packaged in a small outline nonlead package in accordance with the third embodiment of this invention, the packaged semiconductor device being mounted on a board.

Referring to FIG. 12, a semiconductor device packaged in a small outline nonlead plastic package in accordance with this embodiment is placed on a board 5 made of a ceramic material, a glass epoxy resin or the like in a manner that the leads 4 are allowed to contact wirings 6 of the board 5, and the leads 4 and the wirings 6 are soldered employing a soldering material 7 such as solder, copper paste and silver paste. Since the end of the leads 4 has a sector-like shape, the lead 4 has a large surface area by which soldering is conducted or a large surface area on which a soldering material is deposited. As a result, the connection strength between the leads 4 and the wirings 6 is made large, resulting in an improved mechanical reliability of a semiconductor device packaged in a small outline nonlead plastic package in accordance with this embodiment.

Fourth Embodiment

A semiconductor device packaged in a small outline nonlead plastic package having leads each of which is bent downward by 180° to make the shape of J.

Figure 13:
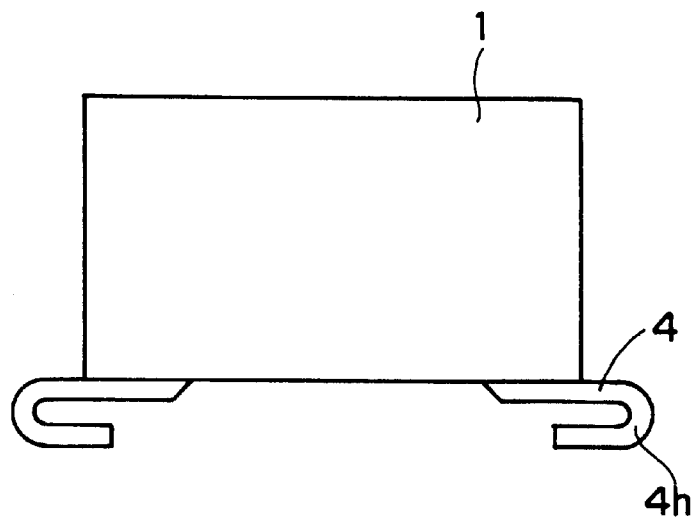
FIG. 13 is a schematic front view of a semiconductor device packaged in a small outline nonlead package in accordance with the fourth embodiment of this invention.

Referring to FIG. 13, the leads 4 of a small outline nonlead plastic package in accordance with this embodiment is bent downward by 180° to make the shape of J 4h.

A method for producing a semiconductor device packaged in a small outline nonlead plastic package having leads each of which is bent downward by 180° to make the shape of J, will be described below. After a semiconductor device chip bonded with a lead frame is molded in a plastic mold, the lead frame is plated a conductive material such as solder, gold or the like which has a large magnitude of wettability for a soldering material such as solder, copper paste and silver paste. The leads 4 extending from the plastic mold I are severed in a length long enough to make the foregoing J-shape of a lead 4. The order of the plating step and the severing step can be reversed.

The ends of the leads 4 are bent downward by 180° to make the shape of J. Care is required to be taken not to make the bent piece a flatly piled plate or to remain a space between the upper half and the lower half of the bent piece. Further, care must be taken to make the lower level of all the lower halves of the bent piece identical to one another.

Figure 14:
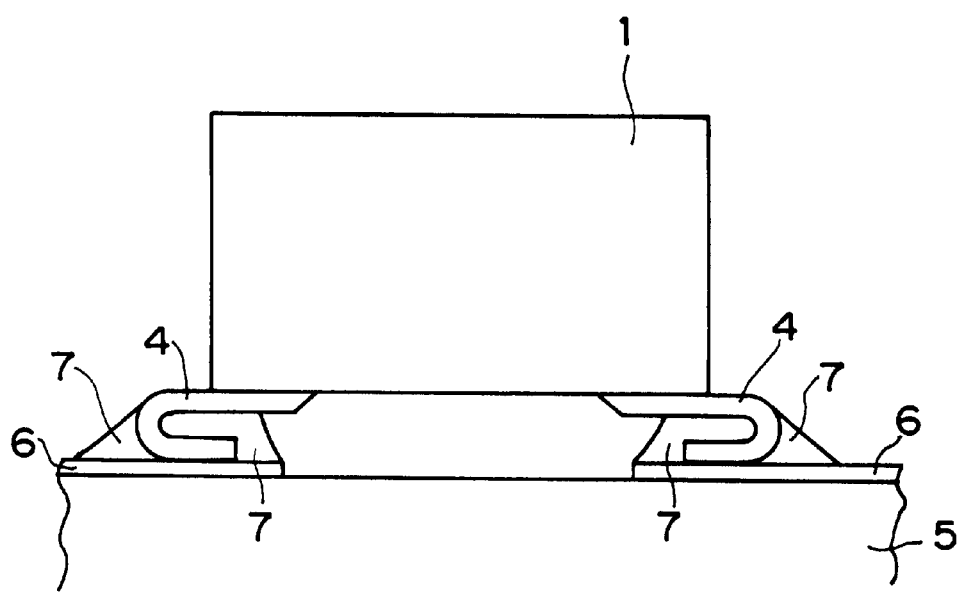
FIG. 14 is a schematic front view of a semiconductor device packaged in a small outline nonlead package in accordance with the fourth embodiment of this invention, the packaged semiconductor device being mounted on a board.
Figure 15:
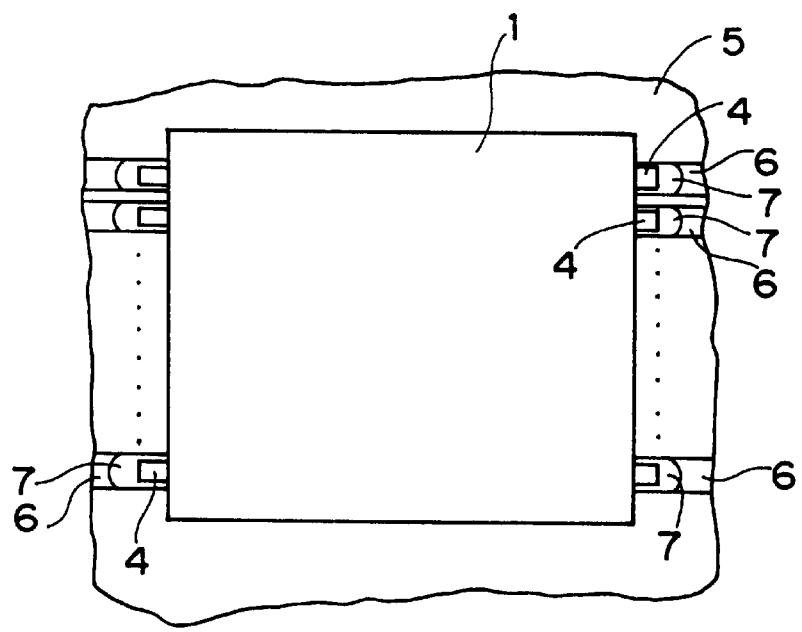
FIG. 15 is a schematic plan view of a semiconductor device packaged in a small outline nonlead package in accordance with the fourth embodiment of this invention, the packaged semiconductor device being mounted on a board.

Referring to FIGS. 14 and 15, a semiconductor device packaged in a small outline nonlead plastic package in accordance with this embodiment is placed on a board 5 made of a ceramic material, a glass epoxy resin or the like in a manner that the leads 4 are allowed to contact wirings 6 of the board 5, and the leads 4 and the wirings are soldered employing a soldering material 7 such as solder, copper paste and silver paste. Since the lead 4 has a J-shape, a large amount of the soldering material 7 is collected in the neighborhood of the leads 4 and the wirings 6. As a result, the leads 4 are strongly connected the wirings 6 to increase the mechanical reliability of the semiconductor device.

Fifth Embodiment

A semiconductor device packaged in a small outline nonlead plastic package having plural plated metal plates arranged on the sides of a plastic mold at locations corresponding to those of the leads.

Figure 16:
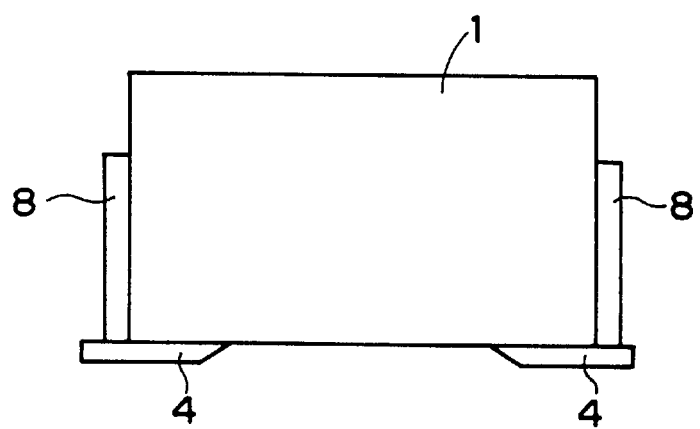
FIG. 16 is a schematic front view of a semiconductor device packaged in a small outline nonlead package in accordance with the fifth embodiment of this invention.
Figure 17:
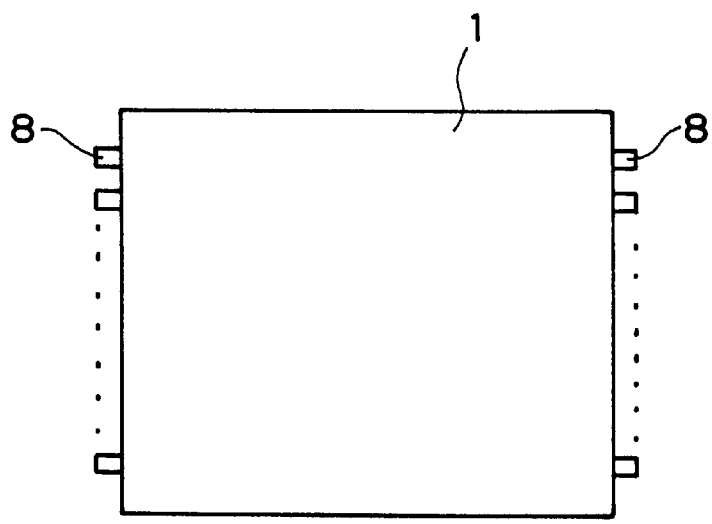
FIG. 17 is schematic plan view of a semiconductor device packaged in a small outline nonlead package in accordance with the fifth embodiment of this invention.

Referring to FIGS. 16 and 17, plural plated metal plates 8 are arranged on the sides of a plastic mold 1 to be connected to leads 4 arranged along the bottom surface of the plastic mold 1.

A method for producing a semiconductor device packaged in a small outline nonlead plastic package having plural plated metal plates arranged on the sides of a plastic mold at locations corresponding to those of the leads, will be described below.

Figure 18:
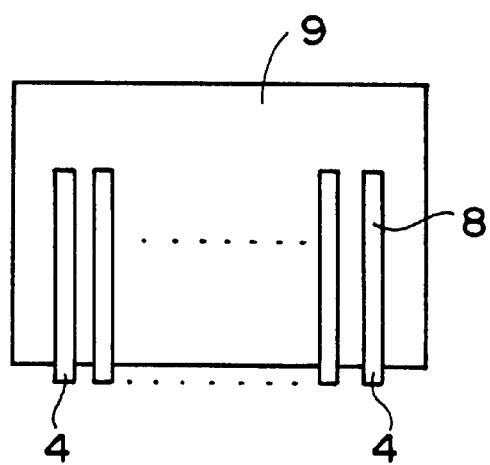
FIG. 18 is a schematic side view of a semiconductor device packaged in a small outline nonlead package in accordance with the fifth embodiment of this invention, under production.
Figure 19:
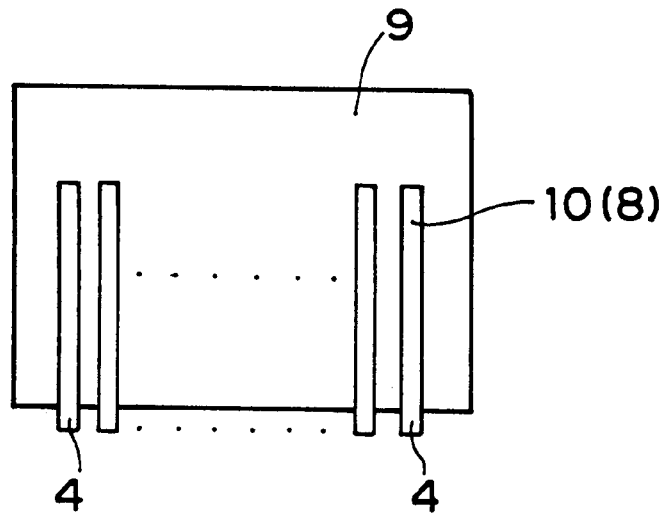
FIG. 19 is a schematic side view of a semiconductor device packaged in a small outline nonlead package in accordance with the fifth embodiment of this invention, under production.

Referring to FIGS. 18 and 19, a photo lithography process is employed to produce a photo resist mask 9 at the area on which metal plates 8 are not plated. An electroless plating process is conducted to plate a metal plate of e.g. copper, silver, gold, palladium or the like or a plate of a soldering material e.g. copper paste, silver paste or the like, on the entire surface of the sides of the plastic mold 1. Then, an electrolytic plating process is conducted to plate a metal plate of e.g. copper, silver, gold, palladium or the like on the metal plate of e.g. copper, silver, gold, palladium or the like or a plate of a soldering material e.g. copper paste, on the plated metal plate produced in the previous process. In this manner, a piled plate 10 made of a plated metal plate of e.g. copper, silver, gold, palladium or the like or a plated plate of a soldering material e.g. copper paste and a plated metal plate of e.g. copper, silver, gold, palladium or the like, is produced on the sides of the plastic mold 1. Then, the photo resist mask 9 is removed to leave plural piled metal plates 10 made of a plated metal plate of e.g. copper, silver, gold, palladium or the like or a plated plate of a soldering material e.g. copper paste and a plated metal plate of e.g. copper, silver, gold, palladium or the like at locations corresponding to those of the leads 4.

Figure 20:
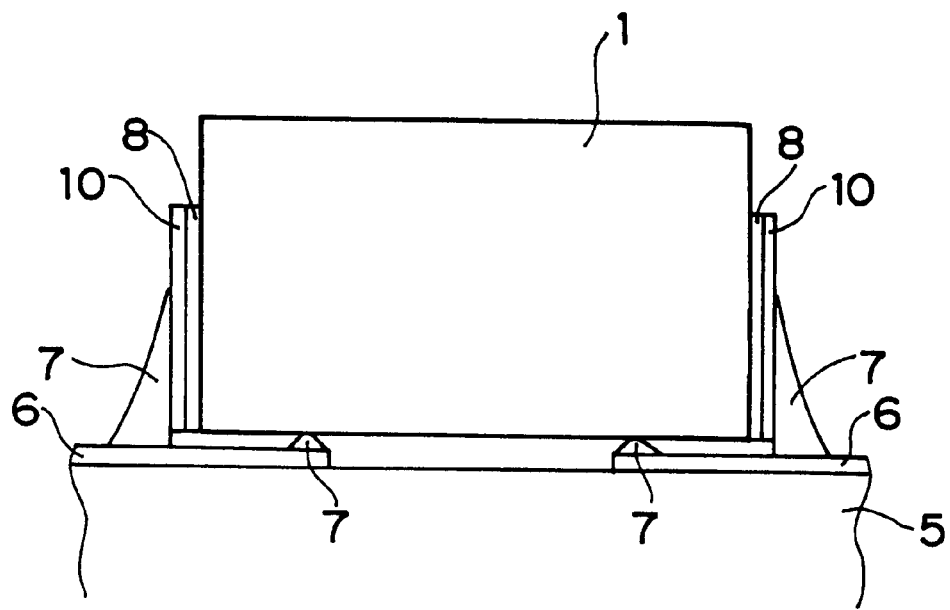
FIG. 20 is a schematic front view of a semiconductor device packaged in a small outline nonlead package in accordance with the fifth embodiment of this invention, the packaged semiconductor device being mounted on a board.

Referring to FIG. 20, a semiconductor device packaged in a small outline nonlead plastic package having plural plated metal plates arranged on the sides of a plastic mold at locations corresponding to those of the leads, is placed on a board 5 made of e.g. a ceramic material, a glass epoxy resin or the like in a manner that the leads 4 are allowed to contact wirings 6 of the board 5, and the leads 4 and the wirings are soldered employing a soldering material 7 such as solder, copper paste and silver paste. Since plated metal plates 10 are arranged along the sides of the plastic mold 1, and since the soldering material 7 readily sticks to the plated metal plates 10, the leads 4 are strongly connected the wirings 6 to increase the mechanical reliability of the semiconductor device.

Sixth Embodiment

A semiconductor device packaged in a small outline nonlead plastic package having plural longitudinal recesses produced on the sides of a plastic mold at locations corresponding to those of the leads and having plural plated metal plates arranged in the longitudinal recesses.

Figure 21:
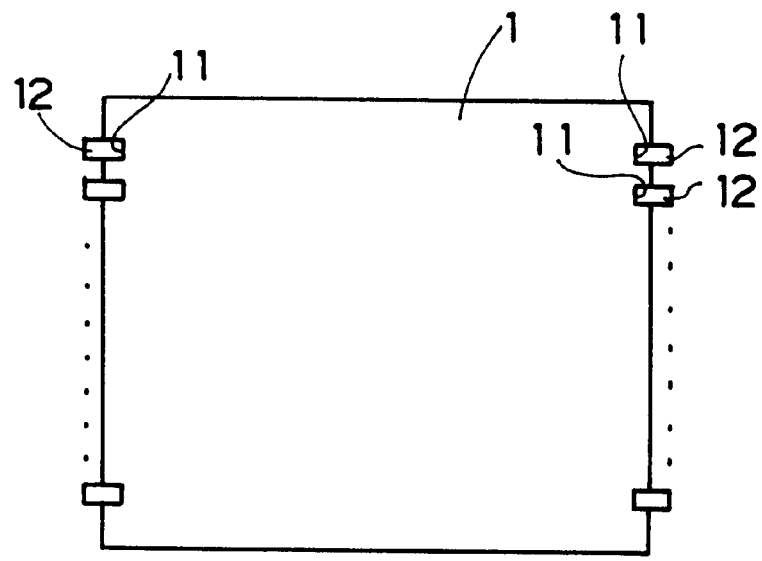
FIG. 21 is a schematic plan view of a semiconductor device packaged in a small outline nonlead package in accordance with the sixth embodiment of this invention.
Figure 22:
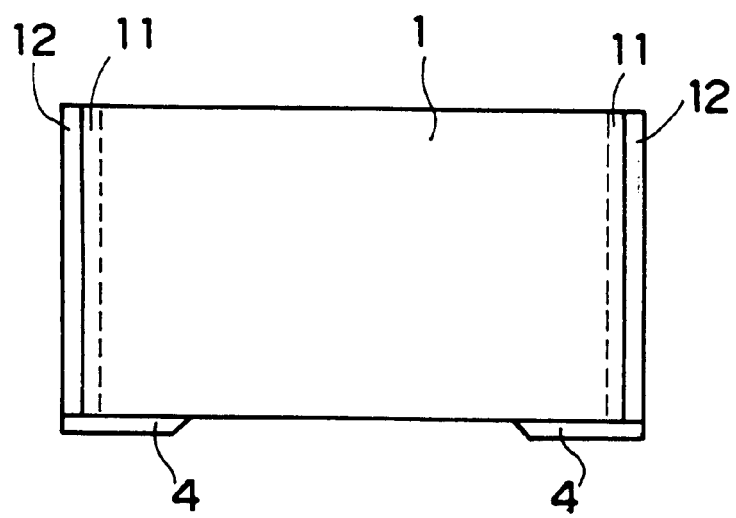
FIG. 22 is a schematic front view of a semiconductor device packaged in a small outline nonlead package in accordance with the sixth embodiment of this invention.

Referring to FIGS. 21 and 22, plural longitudinal recesses 11 are produced on the sides of a plastic mold 1 at locations corresponding to those of the leads 4, and plural plated metal plates 12 are plated in the longitudinal recesses.

The plural longitudinal recesses 11 can be produced on the sides of the plastic mold 1, after the semiconductor device chip 2 (not shown) is molded in the plastic mold 1. Conversely, a plastic mold 1 having the plural longitudinal recesses 11 thereon can be employed as well. In either case, a plating process is employed to plate the plural plated metal plates 12 on the recesses 11.

Figure 23:
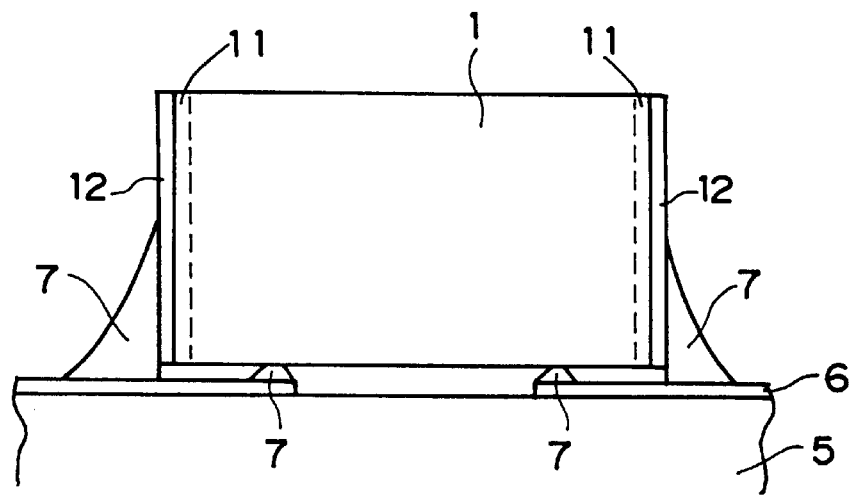
FIG. 23 is a schematic front view of a semiconductor device packaged in a small outline nonlead package in accordance with the sixth embodiment of this invention, the packaged semiconductor device being mounted on a board.

Referring to FIG. 23, the semiconductor device in accordance with the sixth embodiment of this invention (a semiconductor device packaged in a small outline nonlead plastic package having plural longitudinal recesses produced on the sides of a plastic mold at locations corresponding to those of the leads and having plural plated metal plates arranged in the longitudinal recesses) is placed on a printed board 5 made of ceramics, glass epoxy resin or the like and which has wirings 6 thereon in a manner to allow the leads 4 to contact wirings 6 of the board 5, and a soldering process is conducted to solder the leads 4 and the wirings 6. A soldering material such as solder, copper paste, silver paste and the like is employed to solder the leads 4 of the semiconductor device and the wirings 6.

Since the semiconductor device in accordance with the sixth embodiment of this invention has plural plated metal plates 12 on the sides of the plastic mold 1, the soldering material 7 can stick not only to the leads 4 but also to the plural plated metal plates 12. As a result, the leads 4 are strongly connected to the wirings 6 to increase the mechanical reliability of the semiconductor device. Further, the semiconductor device in accordance with this embodiment is allowed to have a smaller interval between the leads 4, because the area by which the soldering material sticks is large.

Seventh Embodiment

A semiconductor device packaged in a small outline nonlead plastic package having plural longitudinal recesses produced on the sides of a plastic mold at locations corresponding to those of the leads, having plural plated metal plates arranged in the longitudinal recesses and having plural plated metal plates arranged on the top surface of the plastic mold at locations corresponding to those of the leads.

Figure 24:
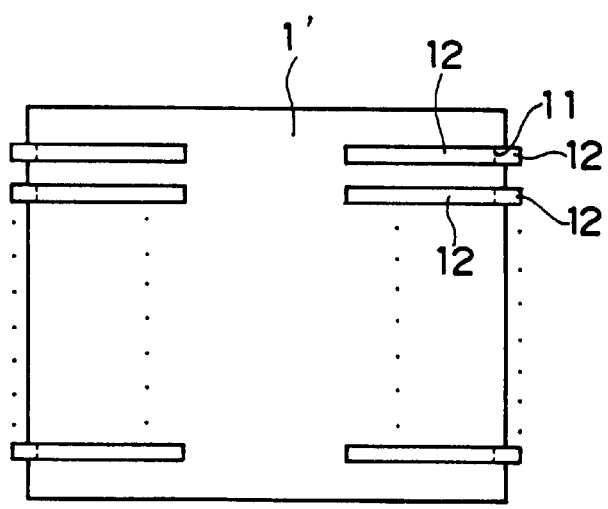
FIG. 24 is a schematic plan view of a semiconductor device packaged in a small outline nonlead package in accordance with the seventh embodiment of this invention.
Figure 25:
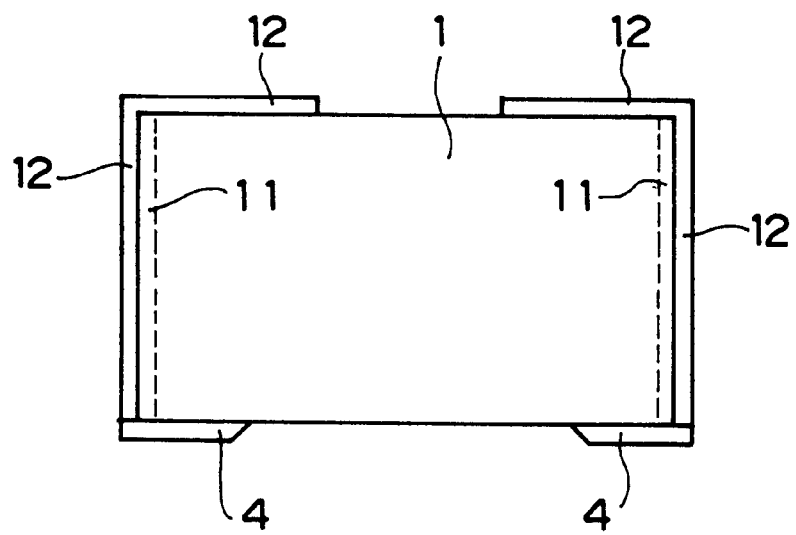
FIG. 25 is a schematic front view of a semiconductor device packaged in a small outline nonlead package in accordance with the seventh embodiment of this invention.

Referring to FIGS. 24 and 25, plural longitudinal recesses are produced on the sides of a plastic mold at locations corresponding to those of the leads and plural plated metal plates 12 are arranged in the longitudinal recesses, as is in the case of the sixth embodiment. In the seventh embodiment, however, each of the plural plated metal plates 12 extends onto the top surface of the plastic mold.

The semiconductor device in accordance with the seventh embodiment of this invention can be produced by a method similar to that of the sixth embodiment of this invention. The only difference from the method of the sixth embodiment of this invention is that the plated metal plate 12 is extended onto the top surface of the plastic mold 1.

Since the semiconductor device in accordance with the seventh embodiment of this invention has plural plated metal plates 12 along the sides of and on the top surface of the plastic mold 1, the soldering material can stick not only to the leads 4 but also to the plural plated metal plates 12. As a result, the leads 4 are strongly connected to the wirings 6 to increase the mechanical reliability of the semiconductor device. Further, the semiconductor device in accordance with this embodiment allows one or more electronic components to be mounted on the plated metal plates 12, resultantly allowing more semiconductor devices to be mounted on a unit area of a printed board.

Eighth Embodiment

A semiconductor device packaged in a small outline nonlead plastic package having plural longitudinal plated metal plates produced along the sides of and on the top surface of a plastic mold at locations corresponding to those of the leads and having one or more electronic components and/or one or more semiconductor devices packaged in plastic packages arranged on the longitudinal plated metal plates produced on the top surface of the plastic mold.

Figure 26:
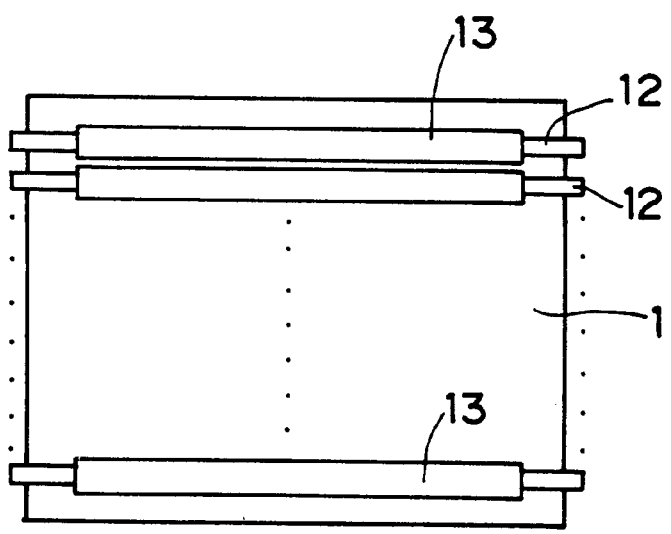
FIG. 26 is a schematic front view of a semiconductor device packaged in a small outline nonlead package in accordance with the eighth embodiment of this invention.
Figure 27:
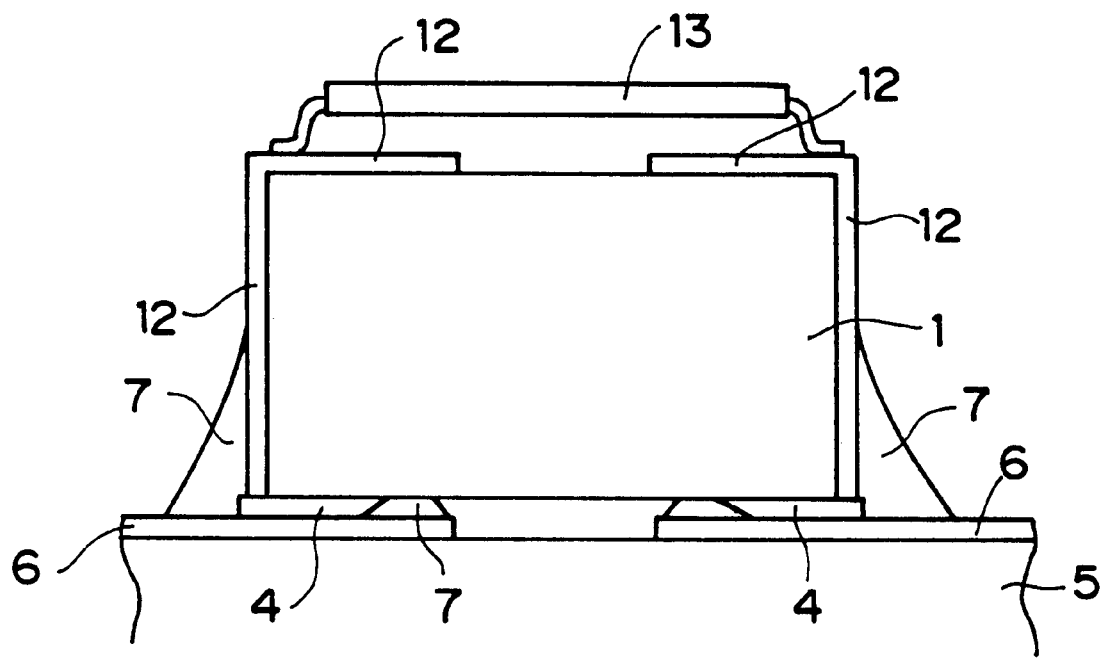
FIG. 27 is a schematic front view of a semiconductor device packaged in a small outline nonlead package in accordance with the eighth embodiment of this inventions, the packaged semiconductor device being mounted on a board.

Referring to FIGS. 26 and 27, plural longitudinal plated metal plates 12 are produced along the sides and on the top surface of a plastic mold 1 at locations corresponding to those of the leads 4, and one or more electronic components and/or one or more semiconductor devices packaged in plastic packages 13 are arranged on the longitudinal plated metal plates 12 produced on the top surface of the plastic mold 1.

The semiconductor device in accordance with the eighth embodiment of this invention can be produced by a method similar to that of the seventh embodiment of this invention. The difference from the seventh embodiment is that one or more electronic components and/or one or more semiconductor devices packaged in plastic packages 13 are arranged on the longitudinal plated metal plates 12 produced on the top surface of the plastic mold 1.

Since the semiconductor device in accordance with the eighth embodiment of this invention has one or more electronic components and/or one or more semiconductor devices packaged in plastic packages arranged on the longitudinal plated metal plates produced on the top surface of the plastic mold, it allows a larger quantity of semiconductor devices to be mounted on a unit area of a printed board.

The foregoing description has clarified that (a) a semiconductor device packaged in a plastic package and having leads horizontally extending along the bottom surface of the plastic package, wherein the mechanical strength is enhanced for connection conducted by soldering the leads and a conductive object, such as wirings, with which the leads are mechanically and electrically connected, (b) a method for producing a semiconductor device packaged in a plastic package and having leads horizontally extending along the bottom surface of the plastic package, wherein the mechanical strength is enhanced for connection conducted by soldering the leads and a conductive object, such as wirings, with which the leads are mechanically and electrically connected and (c) a semiconductor device packaged in a plastic package on which one or more electronic components and/or plastic packaged semiconductor devices are arranged, have been successfully provided by this invention.

Although this invention has been described with reference to various specific embodiments, this description is not meant to be construed in a limiting sense. Various modifications of the disclosed embodiments, as well as other embodiments of this invention which is based on a concept that the surface area for soldering is increased by making the end surface of a lead non-flat, uneven, pulsating or sawtooth shaped for the purpose to increase the mechanical strength of the leads which are connected the wirings of a printed board and for the purpose to allow additional electronic elements to be mounted on the semiconductor device of this invention, will be apparent to persons skilled in the art upon reference to the description of this invention. It is therefore contemplated that the appended claims will cover any such modifications or embodiments as fall within the true scope of this invention.

What is claims is:

1. A semiconductor device, comprising:
   a semiconductor device chip, which has a plurality of bonding pads;
   a plurality of leads, each of which is bonded at a first end to a respective one of the plurality of bonding pads of said semiconductor device chip; and
   a plastic mold packaging said semiconductor device chip bonded to said leads, allowing second ends of said leads to project themselves from a bottom surface of said plastic mold and to extend outward along the bottom surface thereof;
   wherein each of said leads has a horizontal shape in which an edge of a distal end of the second ends is irregular.

2. A semiconductor device in accordance with claim 1, wherein the horizontal shape of each of said leads is a half circle, a half ellipse or a half polygon convex toward the inward direction.

3. A semiconductor device in accordance will claim 1, wherein each of said leads has one or more openings at the end thereof.

4. A semiconductor device in accordance with claim 1, wherein the shape of the edge of each of said lead is the shape of a sector.

5. A semiconductor device, comprising:
   a semiconductor device chip, which has a plurality of bonding pads;
   a plurality of leads, each of which is bonded to a respective one of the plurality of bonding pads of said semiconductor device chip; and
   a plastic mold packaging said semiconductor device chip bonded to said leads, allowing said leads to project themselves from a bottom surface of said plastic mold and to extend outward along the bottom surface thereof;
   wherein the end of each of said leads is bent downward by 180° to oppose each other and make the side view thereof the shape of J.

6. A semiconductor device, comprising:
   a semiconductor device chip, which has a plurality of bonding pads;
   a plurality of leads, each of which is bonded to a respective one of the plurality of bonding pads of said semiconductor device chip; and
   a plastic mold packaging said semiconductor device chip bonded to said leads, allowing said leads to project themselves from a bottom surface of said plastic mold and to extend outward along the bottom surface thereof, said plastic mold having a pair of sides;
   a plurality of longitudinal recesses produced on the sides of said plastic mold at locations corresponding to those of said leads; and
   a plurality of plated metal plates arranged in the longitudinal recesses.

7. A semiconductor device, comprising:
   a semiconductor device chip, which has a plurality of bonding pads;
   a plurality of leads, each of which is bonded to a respective one of the plurality of bonding pads of said semiconductor device chip; and
   a plastic mold packaging said semiconductor device chip bonded to said leads, allowing said leads to project themselves from a bottom surface of said plastic mold and to extend outward along the bottom surface thereof, said plastic mold having a pair of sides;
   a plurality of longitudinal recesses produced on the sides of said plastic mold at locations corresponding to those of said leads;
   a plurality of plated metal plates arranged in the longitudinal recesses and
   a plurality of second plated metal plates arranged on a top surface of said plastic mold in continuation to the plated metal plates arranged along the sides of said plastic mold.

8. A semiconductor device, comprising:
   a semiconductor device chip, which has a plurality of bonding pads;
   a plurality of leads, each of which is bonded to a respective one of the plurality of bonding pads of said semiconductor device chip; and
   a plastic mold packaging said semiconductor device chip bonded to said leads, allowing said leads to project themselves from a bottom surface of said plastic mold and to extend outward along the bottom surface thereof, said plastic mold having a pair of sides;
   a plurality of longitudinal recesses produced on the sides of said plastic mold at locations corresponding to those of said leads;
   a plurality of plated metal plates arranged in the longitudinal recesses and a plurality of second plated metal plates arranged on a top surface of said plastic mold in continuation to the plated metal plates arranged along the sides of said plastic mold;
   wherein one or more electronic components and/or one or more semiconductor devices packaged in plastic packages are arranged on said plated metal plates arranged on the top surface of said plastic mold.

* * * * *